United States Patent [19]

Dow

[11] Patent Number: 5,614,866
[45] Date of Patent: Mar. 25, 1997

[54] ULTRA HIGH GAIN AMPLIFIER

[75] Inventor: Ronald N. Dow, San Jose, Calif.

[73] Assignee: Elantec, Inc., Milpitas, Calif.

[21] Appl. No.: 575,292

[22] Filed: Dec. 20, 1995

Related U.S. Application Data

[63] Continuation-in-part of Ser. No. 328,848, Oct. 25, 1994, Pat. No. 5,479,133.

[51] Int. Cl.$^6$ ................................................. H03F 3/30
[52] U.S. Cl. ........................... 330/267; 330/263; 330/265
[58] Field of Search .................................... 330/255, 263, 330/265, 266, 267, 295

[56] References Cited

U.S. PATENT DOCUMENTS

| | | | |
|---|---|---|---|
| 5,179,355 | 1/1993 | Harvey | 330/265 |
| 5,351,012 | 9/1994 | Toumazou | 330/264 |
| 5,515,005 | 5/1996 | Yoshioka | 330/265 |

OTHER PUBLICATIONS

Schematic—Elantec Model EL 2028 Operational Amplifier.
Schematic—Elantec Model EL 2029 Operational Amplifier.

*Primary Examiner*—James B. Mullins
*Attorney, Agent, or Firm*—Albert C. Smith

[57] ABSTRACT

An amplifier includes an output buffer having an input coupled to a gain node which is the common node of the outputs of first and second current mirrors for receiving a signal current and having an output for providing an amplified drive current. The output buffer includes a first transistor of a first type having its base coupled to a gain node of the output buffer and to the base of a first transistor of a second type for receiving the signal current. The emitter of the first transistor of a first type is coupled to the base of a second transistor of a second type. The emitter of the first transistor of the second type is coupled to the base of a second transistor of the first type. The emitter of the second transistor of the first type is coupled to the emitter of the second transistor of the second type and to the output of the buffer. In response to a programming current and an input signal current, first and second current mirrors of complementary transistor types provide an output signal current to the output buffer and provide biasing currents to the buffer. Third and fourth current sources, which are complementary, each have an terminal coupled to the second input of the respective first and second current sources for providing a biasing current. A fifth current source has a first terminal coupled to the output of the buffer and has a second terminal coupled to the second input of the first current source for providing a compensation current to substantially increase the output impedance of the first current source. A sixth current source has a first terminal coupled to the output of the buffer and has a second terminal coupled to the second input of the second current source for providing a compensation current to substantially increase the output impedance of the second current source.

10 Claims, 6 Drawing Sheets

ULTRA HIGH GAIN AMPLIFIER

CROSS REFERENCE RELATED TO APPLICATION

This application is a continuation-in-part of applicant's application Ser. No. 08/328,848, filed Oct. 25, 1994, now U.S. Pat. No. 5,479,133.

FIELD OF THE INVENTION

The invention relates to amplifier circuits, and in particular, to ultra high gain amplifiers.

BACKGROUND OF THE INVENTION

Single gain stage amplifiers are desirable particularly for high speed/wide bandwidth signal processing because such amplifiers have fewer active components in the signal path, are more readily compensated for loading conditions and temperature, and are generally simpler than multi-stage amplifiers. However, one problem with single gain stage amplifiers is that all of the open loop gain of the amplifier must be delivered by the one gain stage. Single stage amplifiers having low gain typically also have poor DC accuracy and generally have high levels of distortion. For operational amplifiers, the gain figure of interest is the voltage gain from inputs to output. For a current mode feedback amplifier, the transimpedance from the inverting input to the gain node determines the useful gain performance. For both types of amplifiers, an output buffer as another signal stage is commonly connected to the output to obviate any appreciable loading of the gain node.

SUMMARY OF THE INVENTION

In accordance with the present invention, an amplifier includes first and second current sources that each have first and second inputs for receiving a programming current and at least one input current, respectively, and that each have first and second outputs for providing a biasing current and a signal current, respectively. The first and second current sources are of complementary transistor types.

Third and fourth current sources each have an input coupled to the first output of the first and second current sources, respectively, for receiving the biasing current, and each have an output for providing a supply current. The first and second current sources are of complementary transistor types.

An output buffer has an input coupled to the second outputs of the first and second current sources for receiving the signal current and has an output for providing an amplified drive current. The output buffer includes a first transistor of a first type having its base coupled to the input of the output buffer and to the base of a first transistor of a second type. The emitter of the first transistor of a first type is coupled to the base of a second transistor of a second type. The emitter of the first transistor of the second type is coupled to the base of a second transistor of the first type. The emitter of the second transistor of the first type is coupled to the emitter of the second transistor of the second type and to the output of the buffer.

First and second cascode transistors maintain a substantially constant voltage on the collector of the first transistors of the first and second type, respectively, of the output buffer. The emitter of the first cascode transistor is coupled to the collector of the first transistor of the first type of the output buffer. The base of the first cascode transistor is coupled to the output of the third current source. The emitter of a second cascode transistor is coupled to the collector of the first transistor of the second type. The base of the second cascode transistor is coupled to the output of the fourth current source.

A first voltage source coupled between the base of the first cascode transistor and the emitter terminal of the first transistor of the first type of the output buffer maintains a substantially constant voltage on the base and collector of the first transistor of the first type. A second voltage source coupled between the base of the second cascode transistor and the emitter of the first transistor of the second type of the output buffer maintains a substantially constant voltage on the base and collector of the first transistor of the second type.

A first feedback circuit has an input coupled to the collector of the first cascode transistor and an output coupled to the second input of the first current mirror for providing a feedback current indicative of the instantaneous operating current drawn by the first transistor of the first type of the output buffer. A second feedback circuit has an input coupled to the collector of the second cascode transistor and an output coupled to the second input of the second current mirror for providing a feedback current indicative of the instantaneous operating current drawn by the first transistor of the second type of the output buffer.

The present invention also provides an amplifier that includes first and second current sources each having a first input for receiving a programming current, a second input for receiving an input signal current, and a first output for providing an output signal current. The second current source is complementary of the first current source. The first output of the first current source is coupled to the first output of the second current source to form a gain node. Third and fourth current sources each have a first terminal coupled to the second input of the respective first and second current sources for providing a correction current and each have a second terminal for providing a biasing current. The fourth current source is complementary of the third current source.

An output buffer has an input node coupled to the gain node for receiving the output signal currents from the first and second current sources and has an output node for providing an amplified drive current. The output buffer comprises a first transistor of a first type having a base coupled to the input of the output buffer, having an emitter coupled to the second terminal of the third current source, and having a collector. A first transistor of the second type has a base coupled to the base of the first transistor of the first type, has an emitter coupled to the second terminal of the fourth current source, and has a collector. A second transistor of the first type has a base coupled to the emitter of the first transistor of the second type, has an emitter coupled to the output node of the buffer, and has a collector. A second transistor of the second type has a base coupled to the emitter of the first transistor of the first type, has an emitter coupled to the emitter of the second transistor of the first type, and has a collector.

A fifth current source has a first terminal coupled to the output node of the buffer and has a second terminal coupled to the second input of the first current source for providing a compensation current to substantially increase the output impedance of the first current source. A sixth current source has a first terminal coupled to the output of the buffer and has a second terminal coupled to the second input of the second current source for providing a compensation current to substantially increase the output impedance of the second current source.

The first current source comprises a first resistor having first and second terminals, and includes a second resistor having a first terminal and having a second terminal coupled to the second terminal of the first resistor. A third transistor of the first type has an emitter coupled to the first terminal of the first resistor, has a base and a collector each coupled to the common node of the second input of the first current source and of the base of the third transistor of the first type. A fourth transistor of the first type has an emitter coupled to the first terminal of the second resister, has a base coupled to the base of the third transistor of the first type, and has a collector. A fifth transistor of the first type has an emitter coupled to the collector of the third transistor of the first type, has a base coupled to the collector of the fourth transistor of the first type, and has a collector coupled to the first output of the first current source. The compensation current from the fifth current source is indicative of the output voltage compliance dependent base current of the fifth transistor of the first type.

The second current source comprises a third resistor having first and second terminals, and also comprises a fourth resistor having a first terminal and having a second terminal coupled to the second terminal of the third resistor. A third transistor of the second type has an emitter coupled to the first terminal of the first resistor, and has a base and a collector each coupled to the second input of the second current source. A fourth transistor of the second type has an emitter coupled to the first terminal of the fourth resistor, has a base coupled to the base of the third transistor of the second type, and has a collector. A fifth transistor of the second type has an emitter coupled to the collector of the third transistor of the second type, has a base coupled to the collector of the fourth transistor of the second type, and has a collector coupled to the first output of the second current source. The compensation current from the sixth current source is indicative of the output voltage compliance dependent base current of the fifth transistor of the second type.

The fifth current source comprises a sixth transistor of the first type having an emitter, having a base coupled to the second input of the first current source, and having a collector coupled to the output of the buffer. The sixth current source comprises a sixth transistor of the second type having an emitter, having a base coupled to the second input of the second current source, and having a collector coupled to the output of the buffer.

DETAILED DESCRIPTION OF THE PREFERRED EMBODIMENT

Figure 1:
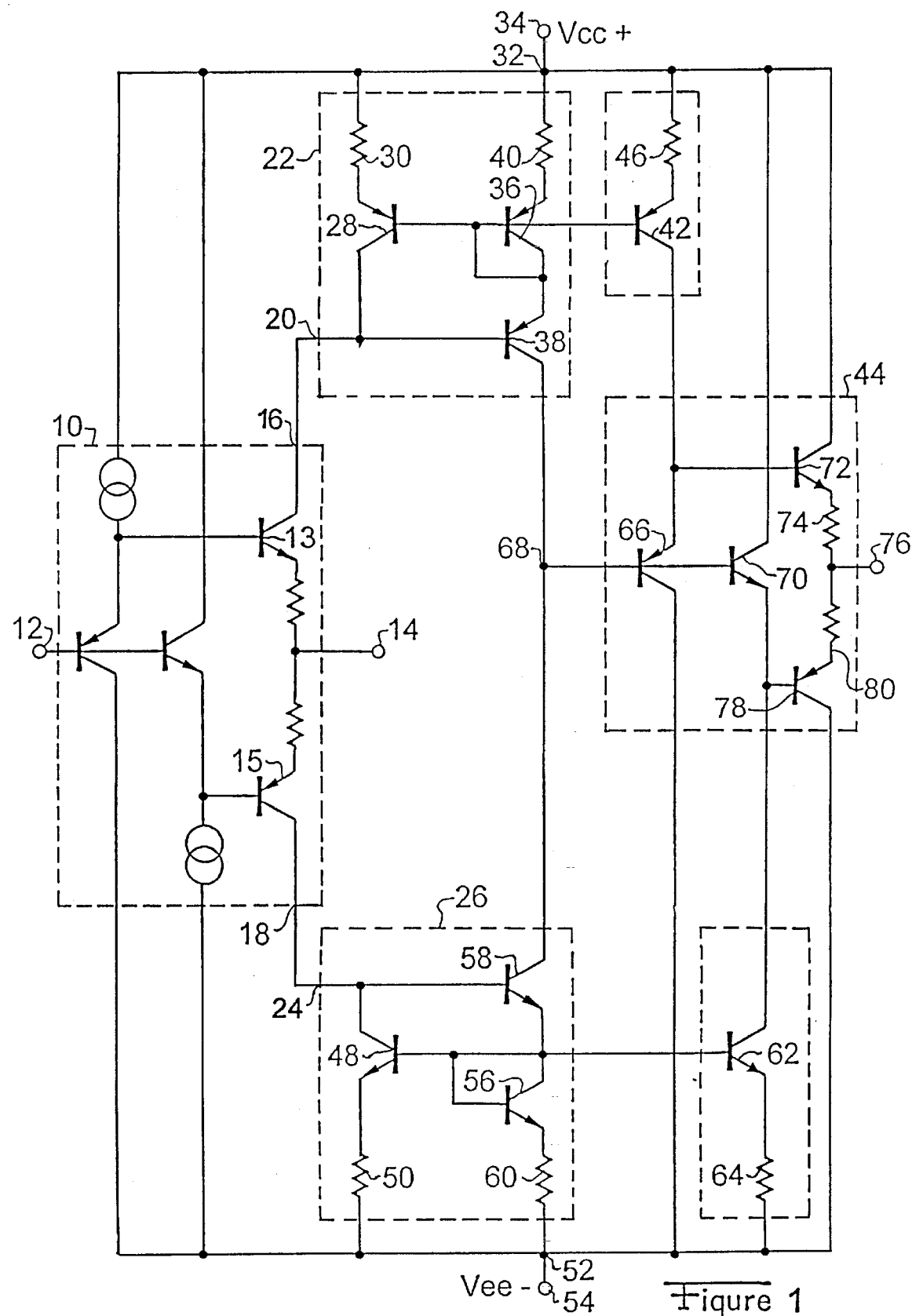
FIG. 1 is a schematic diagram illustrating a gain stage and output buffer of a conventional current mode feedback amplifier.

Referring to FIG. 1, there is shown a gain stage and output buffer of a conventional current mode feedback amplifier, such as a model EL2160 amplifier manufactured by Elantec, Inc. of Milpitas, Calif. An input stage circuit 10 has a first input 12 for receiving a first input voltage and a second input 14 for receiving an input current. The input stage circuit 10 splits the inverting input current into a positive current flowing from a collector 16 of a transistor 13 and a negative current flowing in a collector 18 of a transistor 15. The positive current flowing into the node 16 is coupled to an input terminal 20 of a first current mirror circuit 22. Similarly, the negative current flowing into the node 18 is coupled to an input terminal 24 of a second current mirror circuit 26. The first current mirror circuit 22 and the second current mirror circuit 26 are Wilson current mirror circuits.

The input terminal 20 of the first current mirror circuit 22 is coupled to the common node of the collector of a pnp transistor 28 having a gain factor $A_1$ and the base of a pnp transistor 38. A resistor 30 couples the emitter of the pnp transistor 28 to a voltage terminal 32, which is coupled to an external voltage source 34 having a voltage Vcc. The base of the transistor 28 is coupled to the common node of the base and the collector of a pnp transistor 36 and the emitter of the pnp transistor 38. A resistor 40 couples the emitter of the pnp transistor 36 to the voltage terminal 32. The pnp transistor 38 has a gain factor of N×A1, where N is the desired gain of the amplifier. The resistances of the resistors 30, 40 are selected so that the resistance of the resistor 30 equals N times the resistance of resistor 40. Consequently, the collector of the transistor 38 of the first current mirror circuit 22 provides a current equal to approximately N times the current applied to the input terminal 20 of the current mirror 22.

The collector of a pnp transistor 42 provides a bias current to a buffer circuit 44. A resistor 46 couples the emitter of the pnp transistor 42 to the voltage terminal 32. The emitter of the transistor 38 of the first current mirror 22 drives the base of the transistor 42 so that the instantaneous current of the transistor 42 is the same as the output current of the first current mirror circuit 22.

The second current mirror circuit 26 is complementary to the first current mirror circuit 22 with npn transistors replacing pnp transistors and the resistors being coupled to a voltage Vee. More specifically, the input terminal 24 of the second current mirror 26 is coupled to the common node of the collector of an npn transistor 48 having a gain factor $A_1$ and the base of an npn transistor 56. A resistor 50 couples the emitter of the npn transistor 48 to a voltage terminal 52 which is coupled to an external voltage source 54 having a voltage Vee. The base of the transistor 48 is coupled to the common node of the base and the collector of an npn transistor 56 and the emitter of an npn transistor 58. A resistor 60 couples the emitter of the npn transistor 56 to the voltage terminal 52. The npn transistor 56 has a gain factor of N×A1 where, as above, N is the desired gain of the amplifier. As with the first current mirror 22, the resistances of the resistors 50, 60 are selected so that the resistance of the resistor 50 equals N times the resistance of the resistor 60. The collector of the transistor 58 of the second current mirror circuit 26 provides a current equal to approximately N times the current applied to the input terminal 24 of the second current mirror 26. Both the collector of the pnp transistor 38 and the collector of the npn transistor 58 are coupled to a gain node 68.

The collector of an npn transistor 62 provides a bias current to the buffer circuit 44. A resistor 64 couples the emitter of the npn transistor 62 to the voltage terminal 52. The emitter of the transistor 58 of the second current mirror 26 drives the base of the transistor 62 so that the instantaneous current of the transistor 62 is the same as the output current of the second current mirror circuit 26.

The buffer circuit 44 includes a pnp transistor 66, an npn transistor 70, an npn transistor 72, and a pnp transistor 78. The bases of both the pnp transistor 66 and the npn transistor 70 are coupled to the gain node 68. The pnp transistor 66 and the npn transistor 72 are coupled in a Darlington arrangement. The base of the transistor 72 is coupled to the emitter of the pnp transistor 66 and also to the collector of the pnp transistor 42. Similarly, the npn transistor 70 and the pnp transistor 78 are coupled in a Darlington arrangement. The base of the pnp transistor 78 is coupled to the emitter of the npn transistor 70 and also to the collector of the npn transistor 62. A resistor 74 couples the emitter of the npn transistor 72 to an output terminal 76, and a resistor 80 couples the emitter of the pnp transistor 78 to the output terminal 76. The collectors of the pnp transistors 66, 78 are each coupled to the voltage terminal 52, and the collectors of the npn transistors 70, 72 are each coupled to the voltage terminal 32.

The amplifier of FIG. 1 may have, for example, a transimpedance in the range of 500 kiloohms to 2 megohms. The gain performance of the amplifier is limited by Early effects in the buffer transistors 66, 70, the loading of the gain node 68 through the output buffer 44, the output impedance of the gain mirrors 22, 26, and the voltage compliance range of the input stage. The compliance range is limited by the voltage drops of the input devices of 28, 38, 48, 58 of the current mirrors, especially at lower supply voltages.

Figure 2:
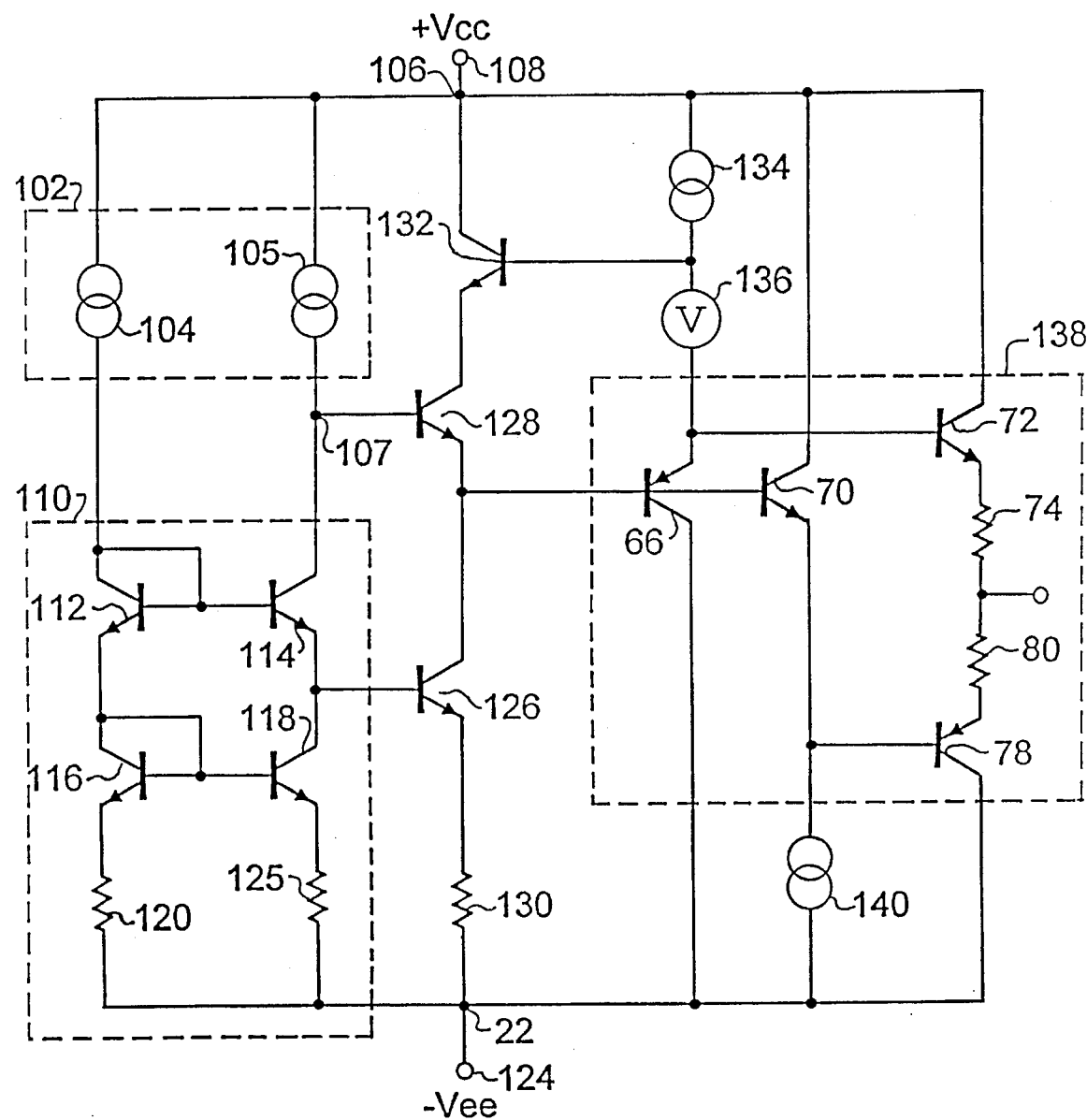
FIG. 2 is a schematic diagram illustrating a gain stage and output buffer of another conventional amplifier.

Referring to FIG. 2, there is shown a gain stage and output buffer of another conventional amplifier, such as model HA2600 manufactured by Harris, or a model EC2600 manufactured by Elantec, Inc. A differential current source 102 has a first current source 104 and a second current source 105. The first current source 104 couples a terminal of a current mirror 110 to a voltage terminal 106, which is coupled to a voltage source 108 having a voltage Vcc. The second current source 105 couples the common node of another terminal of the current mirror 110 and a gain node 107 to the voltage terminal 106. The differential current source is representative of the currents from an input stage.

The current source 104 is coupled to the common node of the collector and the base of an npn transistor 112 and the base of an npn transistor 114. The emitter of the npn transistor 112 is coupled to the common node of the collector and the base of an npn transistor 116 and the base of an npn transistor 118. A resistor 120 couples the emitter of the npn transistor 116 to a voltage terminal 122, which is coupled to an external voltage source 124 having a voltage Vee. The collector of the transistor 118 is coupled to the emitter of the npn transistor 114. A resister 125 couples the emitter of the transistor 118 to the voltage terminal 122.

The base of a npn transistor 126 is coupled to the common node of the collector of transistor 118 and emitter of the transistor 114. The collector of the npn transistor 126 provides current to the emitter of an npn transistor 128. A resistor 130 couples the emitter of the npn transistor 126 to the voltage terminal 122. The resistance of the resistors 120, 125, 130 and the area ratios of the transistors 116, 118, 126 are selected so that the collector current of transistor 126 is approximately twice the collector current of the transistor 114.

The current source 105 drives the base of the npn transistor 128. The collector of the npn transistor 128 is coupled to the emitter of a cascode npn transistor 132. The collector of the cascode transistor 132 is coupled to the voltage terminal 106. The cascode transistor 132 maintains the base to collector voltage of the npn transistor 128 at an approximately constant voltage over the output buffer voltage compliance range. A current source 134 couples the common node of the base of the npn transistor 132 and voltage source 136 to the voltage terminal 106. The voltage source 136 couples to the base of the npn transistor 132 to a buffer output 138. The buffer output 138 comprises the pnp transistor 66, the npn transistor 70, the npn transistor 72, the pnp transistor 78, the resistor 74, and the resistor 80 which are all arranged as in the buffer circuit 44 shown in FIG. 1. More specifically, the voltage source 136 is coupled to the emitter of the pnp transistor 66 and to the base of the npn transistor 72. A current source 140 couples the emitter of the npn transistor 70 and the base of the pnp transistor 78 to the voltage terminal 122. The transistor 128 buffers the gain node 107 and drives the output stage buffer 138.

In this amplifier, the collector to base voltages of the transistors 114, 126 are equal. Consequently, the base currents of the transistors 114, 126 maintain a precise 2:1 ratio over the voltage compliance range of the gain node and the output. By maintaining this ratio, the effects of the output compliance varying base currents of the transistors 114, 126 cancel and do not appear at the gain node 107. The impedance at the gain node 107 may be, for example, in the 10 to 100 megohm range.

The performance of the amplifier of FIG. 2 is limited by the output impedance of the differential input current sources 102, which operates in parallel with the collector of the transistor 114 to determine the actual impedance at the gain node. In addition, the npn transistor 128 in the signal path in series with the output buffer 138 adds phase shift to the frequency response and degrades high frequency performance.

Figure 3:
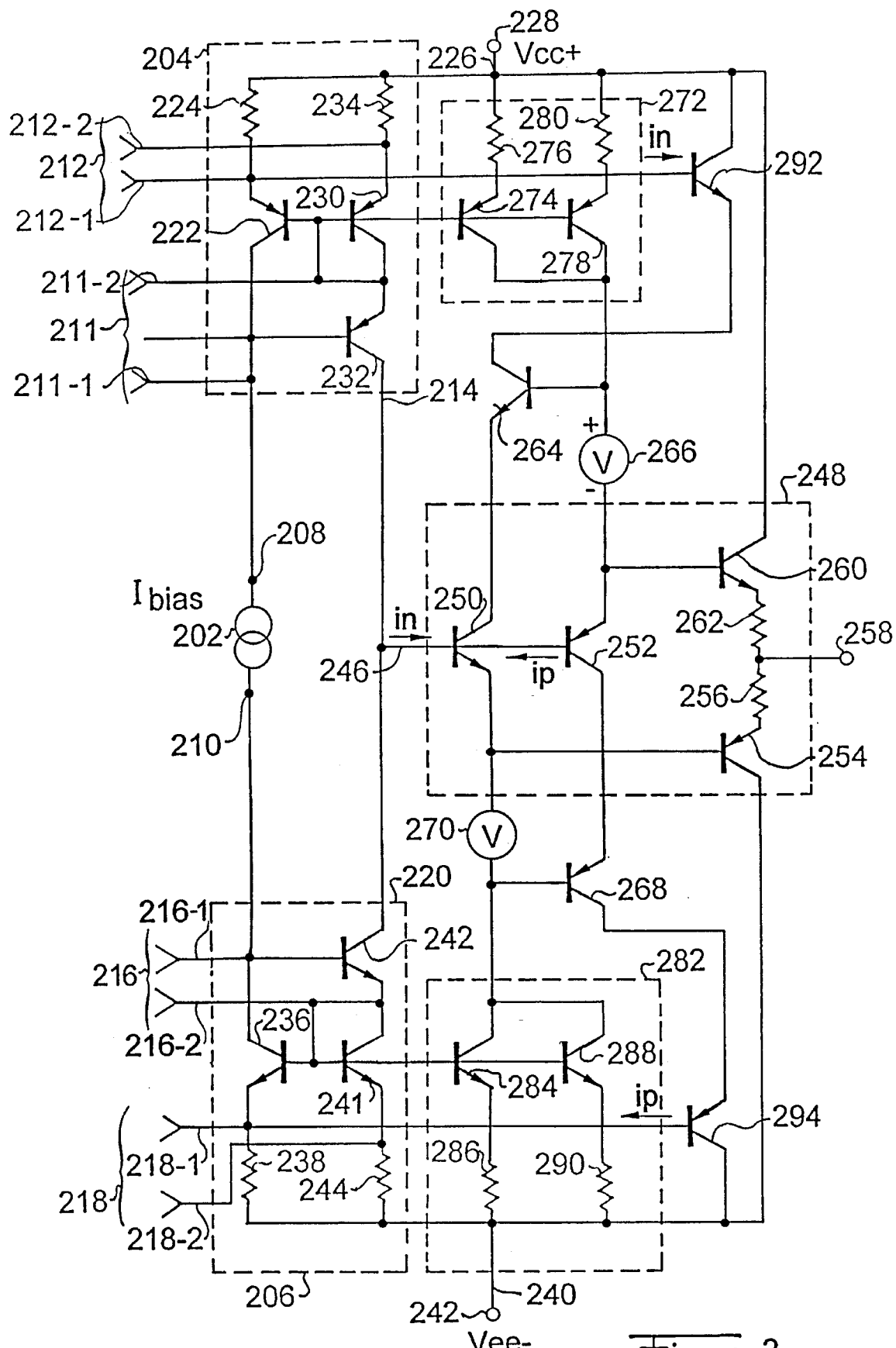
FIG. 3 is a schematic diagram illustrating a dual current gain mirror with buffered output according to an embodiment of the present invention.

Referring to FIG. 3, there is shown a schematic diagram illustrating a dual current gain mirror with buffered output according to an embodiment of the present invention. An amplifier includes a DC programming current source 202 having first and second terminals 208, 210 for providing a programming current to a first current source 204 and a second current source 206, respectively. The first current source 204 has a first input terminal 211-1, −2 (a differential current input terminal) for receiving a first input current, a second input terminal 212-1, −2 (a differential current input terminal) for receiving a second input current (a differential current and a feedback current, later described herein), and an output terminal 214 for providing a signal current that is determined from both the first input current received at the first input terminal 211 and the second input current received at the second input terminal 212. It should be noted that the amplifier if coupled to external circuitry preferably has either the first input terminal 211 or the second input terminal 212 coupled to such external circuitry.

Similarly, the second current source 206 has a first input terminal 216-1 coupled to the second terminal 210 of the bias current source 202 for receiving a first input current, a second input terminal 218 for receiving a second input current (a differential current and a feedback current, later described herein), and an output terminal 220 for providing a signal current that is determined from both the first input current received at the first input terminal 216-1, −2 and the second input current received at the second input terminal 218-1, −2. The first current mirror 204 is similar to the current mirror 22 of FIG. 1. The second current mirror 206 is similar to the current mirror 26 of FIG. 1.

The first and second current sources 204, 206 are Wilson current mirrors. The transistors in the second current mirror 206 are complementary in transistor type to the transistors in the first current mirror 204.

The input terminal 211-1 of the first current mirror circuit 204 is coupled to the common node of the collector of a pnp transistor 222 having a gain factor $A_1$ and the base of a pnp transistor 232. A resistor 224 couples the common node of the emitter of the pnp transistor 222 and the input terminal 212-1 to a voltage terminal 226, which is coupled to an external voltage source 228 having a voltage Vcc. The base of the transistor 222 is coupled to the common node of the base and the collector of a pnp transistor 230 and to the emitter of the pnp transistor 232. A resistor 234 couples the common node of the emitter of the pnp transistor 230 and the input terminal 212-2 to the voltage terminal 226 The pnp transistor 230 has a gain factor of N×A1, where N is the desired gain of the amplifier. The resistance of the resistors 224, 234 are selected so that the resistance of the resistor 224 equals N times the resistance of the resistor 234. The first current mirror circuit 204 provides from the collector of the transistor 232 a current equal to approximately N times the current applied to the input terminals 211, 212 of the current mirror 204.

The second current mirror circuit 206 is complementary to the first current mirror circuit 204 with npn transistors replacing pnp transistors and the resistors being coupled to a voltage Vee. More specifically, the input terminal 216-1 of the second current mirror 206 is coupled to the common node of the collector of an npn transistor 236 having a gain factor $A_1$ and the base of an npn transistor 242. A resistor 238 couples the emitter of the npn transistor 236 to a voltage terminal 240, which is coupled to an external voltage source 242 having a voltage Vee. The base of the transistor 236 is coupled to the common node of the base and the collector of an npn transistor 240 and the emitter of the npn transistor 242. A resistor 244 couples the common node of the emitter of the npn transistor 240 and the input terminal 218-2 to the voltage terminal 240. The npn transistor 240 has an area factor of N×A1, where N is the desired gain of the amplifier. As with the first current mirror 204, the resistance of the resistors 238, 244 are selected so that the resistance of the resistor 238 equals N times the resistance of the resistor 244. The second current mirror circuit 206 provides from the collector of the transistor 242 a current equal to approximately N times the current applied to the input terminals 216, 218 of the current mirror 206. The output terminal 214 of the first current mirror 204 and the output terminal 220 of the second current mirror 206 are both coupled to a gain node 246.

A buffer circuit 248 coupled to the gain node 246 has a high input impedance. The input impedance ranges from, for example, 20 megohms to 100 megohms. The buffer circuit 248 is similar to the buffer circuit 44 of FIG. 1. The buffer circuit 248 has an npn transistor 250 and a pnp transistor 252 each having a base coupled to the gain node 246. A pnp transistor 254 and the npn transistor 250 are coupled in a Darlington arrangement. The base of the pnp transistor 254 is coupled to the emitter of the npn transistor 250. The collector of the transistor 254 is coupled to the voltage terminal 240. A resistor 256 couples the emitter of the npn transistor 254 to an output terminal 258 for providing an amplified drive current for driving a load (not shown). In a similar manner, a npn transistor 260 and the pnp transistor 252 are coupled in a Darlington arrangement. The base of the npn transistor 260 is coupled to the emitter of the pnp transistor 252. The collector of the npn transistor 260 is coupled to the voltage terminal 226. A resistor 262 couples the emitter of the npn transistor 260 to the output terminal 258.

The emitter of a cascode npn transistor 264 is coupled to the collector of the npn transistor 250 for providing a substantially constant base-collector voltage across the npn transistor 250 in order to reduce the Early effect on the gain node 246 from changes in the voltage across the emitter and the base of the transistor 250 A first voltage source 266 has a positive terminal coupled to the base of the cascode npn transistor 264 and a negative terminal coupled to the emitter of the pnp transistor 252 for forming a voltage difference between the bases of the transistors 260, 264 so that the voltage between the collector and the base of the transistor 250 is substantially constant over the output voltage compliance range.

The emitter of a cascode pnp transistor 268 is coupled to the collector of the pnp transistor 252 for providing a substantially constant base-collector voltage across the pnp transistor 252 in order to reduce the Early effect on the gain node 246 front changes in the voltage across the emitter and the base of the transistor 252. A second voltage source 270 has a positive terminal coupled to the emitter of the npn transistor 250 and a negative terminal coupled to the base of the cascode pnp transistor 268 for forming a voltage difference between the bases of the transistors 252, 254 so that the voltage between the collector and the base of the transistor 252 is substantially constant over the output voltage compliance range. Each of the first and second voltage sources 266, 270 may be a battery or a voltage drop across a resistor or across at least one diode.

A third current source 272 for providing a current approximately N×(N+1) times the current from the first current mirror 204 includes a resistor 276 coupling the emitter of a pnp transistor 274 to the first voltage terminal 226. The common node of the base of the pnp transistor 274 and the base of a pnp transistor 278 is coupled to the base of the transistor 222 of the first current mirror 204. A resistor 280 couples the emitter of the pnp transistor 278 to the voltage terminal 226. The collectors of the pnp transistor 274 and the pnp transistor 278 are coupled to the common node of the positive terminal of the first voltage source 266 and the base of the first cascode transistor 264.

A fourth current source 282 for providing a current approximately N×(N+1) times the current from the second current mirror 206 includes a resistor 286 coupling the emitter of an npn transistor 284 to the voltage terminal 240. The common node of the base of the npn transistor 284 and the base of a npn transistor 288 is coupled to the base of the npn transistor 236 of the second current mirror 206. A resistor 290 couples the emitter of the npn transistor 288 to the voltage terminal 240. The collectors of the npn transistors 284, 288 are coupled to the common node of the negative terminal of the second voltage source 270 and the base of the second cascode transistor 268. Two transistors are shown in the current sources 272, 282 for illustrative purposes; the current sources may be, for example, a single transistor. The transistors 274, 278, 284, 288 each preferably have an area factor of N.

A first feedback npn transistor 292 has the base coupled to the input terminal 212-1 of the first current mirror, the emitter coupled to the collector of the first cascode transistor 264, and the collector coupled to the voltage terminal 226. The first feedback transistor 292 provides a feedback current that is indicative of the instantaneous operating current of the npn transistor 250 to cause the first current mirror 204 to provide such base current.

A second feedback pnp transistor 294 has a base coupled to the input terminal 218-1 of the second current mirror, the emitter coupled to the collector of the second cascode transistor 268, and the collector coupled to the voltage terminal 240. The second feedback transistor 294 provides a feedback current that is indicative of the instantaneous operating current of the pnp transistor 252 to cause the second current mirror 206 to provide such base current. The feedback of the feedback circuits 292, 294 provides dynamic adjustment from the current mirrors for the current drawn by the output buffer.

Figure 4:
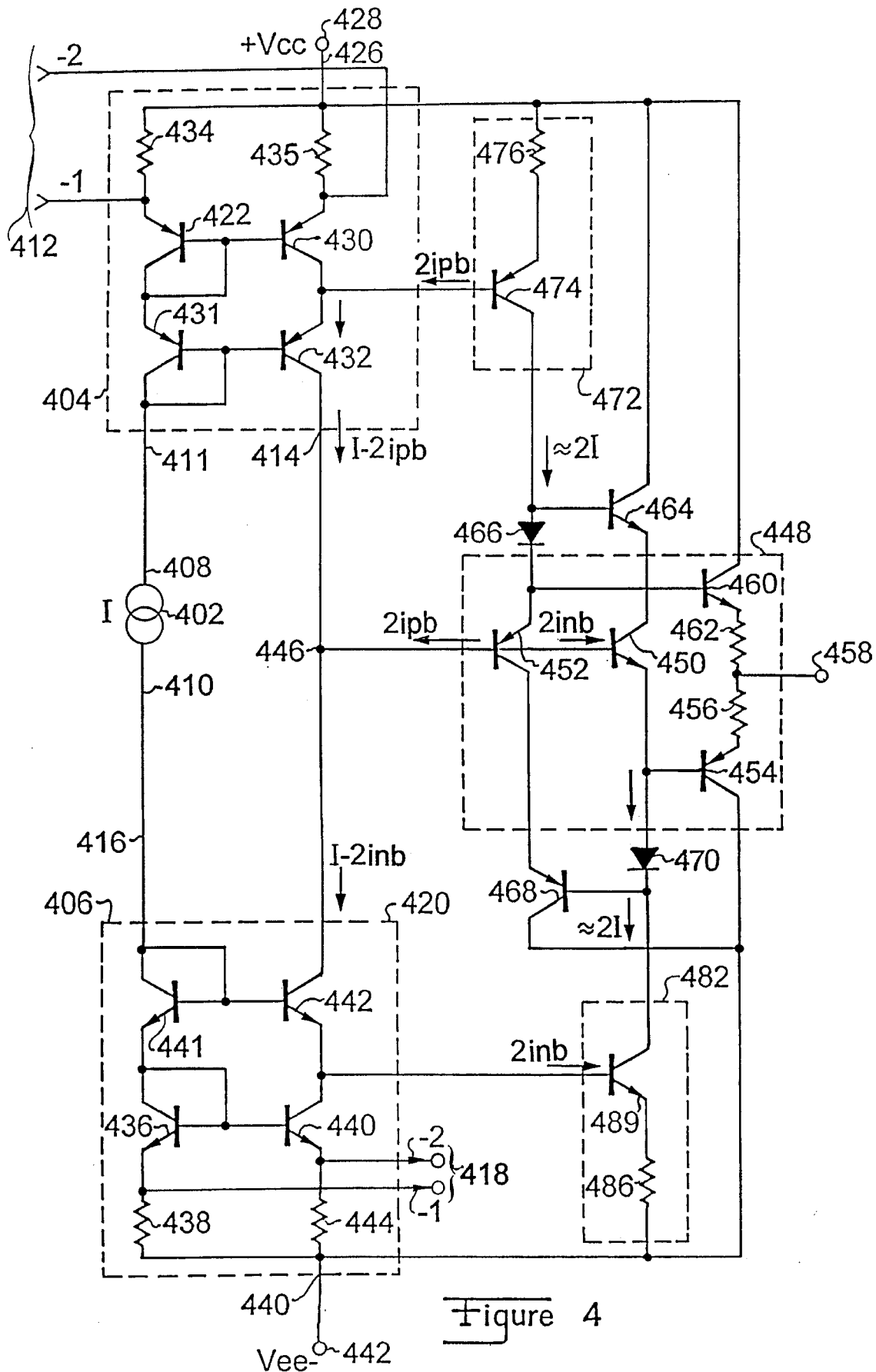
FIG. 4 is a schematic diagram illustrating a dual current gain mirror with buffered output and compensation for D.C. base currents in accordance with another embodiment of the present invention.

Referring to FIG. 4, there is shown a schematic diagram illustrating dual current gain mirrors with buffered outputs and compensation for D.C. base currents in accordance with another embodiment of the invention. An amplifier has a bias current source 402 for providing a programming current to a first current source 404 and a second current source 406. The bias current source 402 has first and second terminals 408, 410, respectively. The first current source 404 has a first input terminal 411 for receiving a first input current, a second input terminal 412-1, –2 (a differential current input terminal) for receiving a second input current, and an output terminal 414 for providing a biasing current that is determined from both the first input current received at the first input terminal 411 and the second input current received at the second input terminal 412.

Similarly, the second current source 406 has a first input terminal 416 coupled to the second terminal 410 of the bias current source 402 for receiving a first input current, a second input terminal 418-1, –2 (a differential current input terminal) for receiving a second input current, and an output terminal 420 for providing an output current that is determined from the first input current received at the first input terminal 416 and the second input current received at the second input terminal 418.

The first and second current sources 404, 406 are current mirrors. The transistors in the second current mirror 406 are complementary in transistor type to the transistors in the first current mirror 404.

The first current mirror 404 includes a resistor 434 which couples the common node of the input terminal 412-1 of the first current mirror circuit 404 and the emitter of a pnp transistor 422 to a voltage terminal 426, which is coupled to an external voltage source 428 having a voltage Vcc. The base of the transistor 422 is coupled to the common node of the collector of the pnp transistor 422, the base of a pnp transistor 430 and the emitter of a pnp transistor 431. A resistor 434 couples the common node of the emitter of the pnp transistor 430 and the input terminal 412-2 to the voltage terminal 426. The base of the pnp transistor 431 is coupled to the common node of the collector of the pnp transistor 431, the base of the pnp transistor 432, and the input terminal 411. The collector of the pnp transistor 432 is coupled to the output terminal 414. The output terminal 414 of the first current mirror circuit 404 provides a biasing current equal to approximately N times the current applied to the input terminal 411 of the current mirror 404.

The second current mirror circuit 406 is complementary to the first current mirror circuit 404 with npn transistors replacing pnp transistors and the resistors being coupled to a voltage Vee. More specifically, a resistor 438 couples the common node of the input terminal 418-1 of the second current mirror 406 and the emitter of an npn transistor 436 to a voltage terminal 440, which is coupled to an external voltage source 442 having a voltage Vee. The base of the transistor 436 is coupled to the common node of the collector of the transistor 436, the base of an npn transistor 440, and the emitter of an npn transistor 441. A resistor 444 couples the common node of the emitter of the npn transistor 440 and the input terminal 418-2 of the second current mirror 406 to the voltage terminal 440. The base of the pnp transistor 441 is coupled to the common node of the collector of the pnp transistor 441, the input terminal 416, and the base of the npn transistor 442. The second current mirror circuit 406 provides from the collector of the transistor 442 a current equal to approximately N times the current applied to the input terminal 416 of the current mirror 406. The output terminal 414 of the first current mirror 404 and the output terminal 420 of the second current mirror 406 are both coupled to a gain node 446.

A buffer circuit 448 coupled to the gain node 446 has a high input impedance. The input impedance may range, for example, from 20 to 100 megohms. The buffer circuit 448 is similar to the buffer circuit 248 of FIG. 3. The buffer circuit 448 has an npn transistor 450 and a pnp transistor 452 each having a base coupled to the gain node 446. A pnp transistor 454 and the npn transistor 450 are coupled in a Darlington arrangement. The base of the pnp transistor 454 is coupled to the emitter of the npn transistor 450. The collector of the transistor 454 is coupled to the voltage terminal 440. A resistor 456 couples the emitter of the npn transistor 454 to an output terminal 458 for driving a load (not shown). In a similar manner, npn transistor 460 and the pnp transistor 452 are coupled in a Darlington arrangement. The base of the npn transistor 460 is coupled to the emitter of the pnp transistor 452. The collector of the npn transistor 460 is coupled to the voltage terminal 426. A resistor 462 couples the emitter of the npn transistor 460 to the output terminal 458.

A cascode transistor 464 provides a substantially constant base-collector voltage across the transistor 450. The emitter of the cascode npn transistor 464 is coupled to the collector of the npn transistor 450. The collector of the transistor 464 is coupled to the voltage terminal 426. A first voltage source 466 has a first terminal coupled to the base of the cascode npn transistor 464 and a second terminal coupled to the emitter of the pnp transistor 452 for maintaining a substantially constant voltage between the collector and the base of the transistor 450 over the output voltage compliance range.

A cascode transistor 468 provides a substantially constant base-collector voltage across the transistor 452. The emitter of the cascode pnp transistor 468 is coupled to the collector of the pnp transistor 452, and the collector of the transistor 468 is coupled to the voltage terminal 440. A second voltage source 470 has a first terminal coupled to the emitter of the npn transistor 450 and a second terminal coupled to the base of the cascode pnp transistor 468 for maintaining a substantially constant voltage between the collector and the base of the transistor 452 over the output voltage compliance range.

A third current source 472 provides a bias current approximately N×(N+1) times the current from the first current mirror 404 to the buffer current 448. The base of a pnp transistor 474 is coupled to the common node of the collector of the pnp transistor 430 and the emitter of the pnp transistor 432 of the first current mirror 404. A resistor 476 couples the emitter of the pnp transistor 474 to the voltage terminal 426. The collector of the transistor 474 is coupled to the first terminal of the first diode 466.

A fourth current source 482 provides a bias current approximately N×(N+1) times the current from the second current mirror 406 to the buffer circuit 448. The base of a npn transistor 489 is coupled to the common node of the collector of the npn transistor 440 and the emitter of the npn transistor 442 of the second current mirror 406. A resistor 486 couples the emitter of the npn transistor 489 to the voltage terminal 440. The collector of the npn transistor 489 is coupled to the cathode of the second diode 470.

Figure 5:
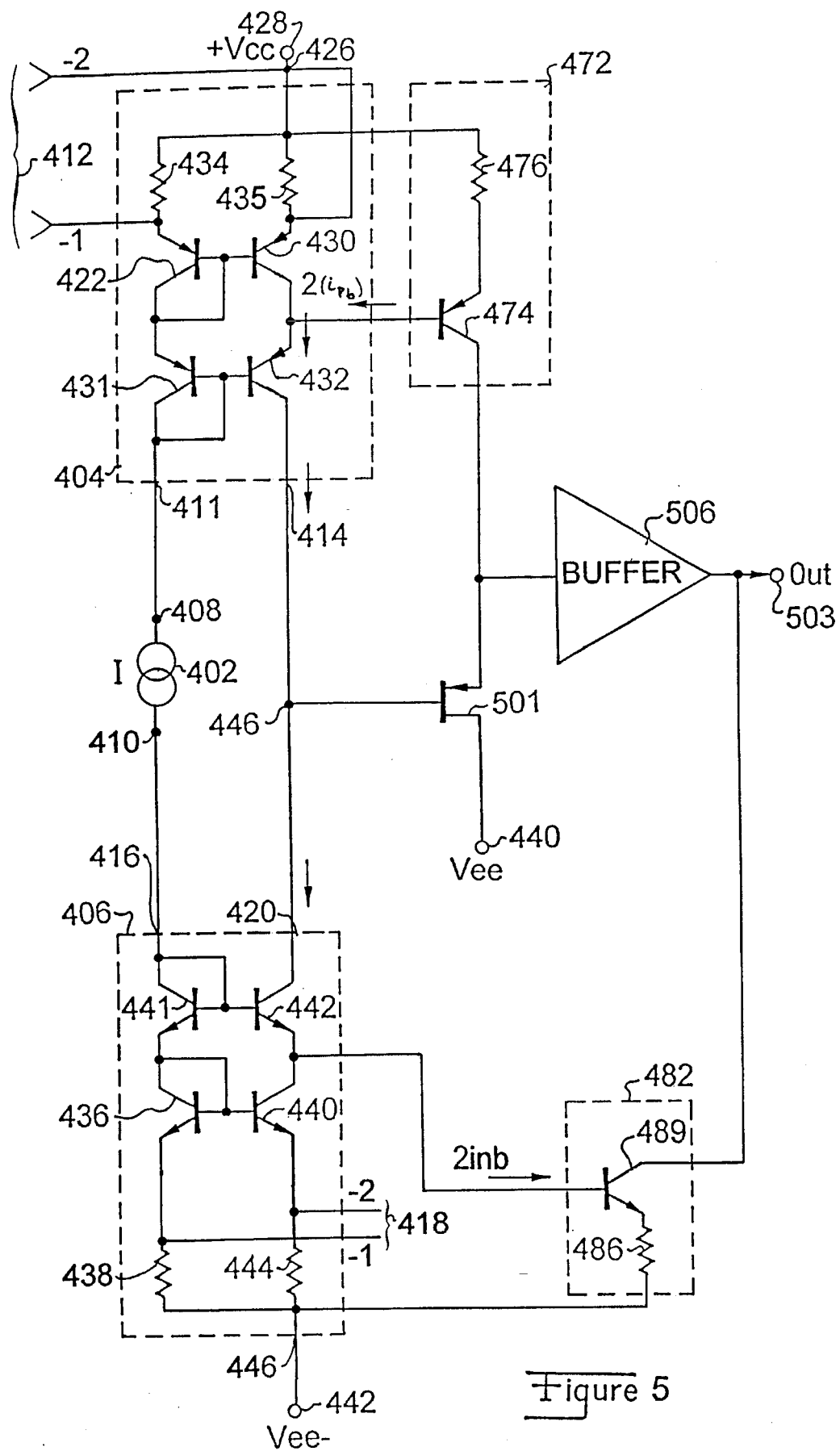
FIG. 5 is a schematic diagram illustrating a dual current gain mirror with buffered output in accordance with yet another embodiment of the present invention.

Referring to FIG. 5, there is shown a schematic diagram illustrating a dual current gain mirror in accordance with yet another embodiment of the present invention. Like elements of the circuit of FIG. 5 have like reference numbers to the like elements of the circuit of FIG. 4. First and second current sources 404, 406 are coupled together and to third and fourth current sources 472, 482 as described earlier herein in conjunction with FIG. 4. An output 414 of the first current mirror 404 and an output 420 of the second current mirror 406 are coupled to the input of an output buffer 500. The gate of a p-type field effect transistor (FET) 501 is coupled to the input of the output buffer 500.

The source of the FET 501 is coupled to fine common node of the collector of a pnp transistor 474 and an input terminal of a load buffer 502. The drain of the FET 501 is coupled to the voltage terminal 440. The output of the load buffer 502 is coupled to the common node of the collector of an npn transistor 489 and an output terminal of the output buffer 500 which is coupled to the output terminal 503 for providing an amplified drive current.

Figure 6:
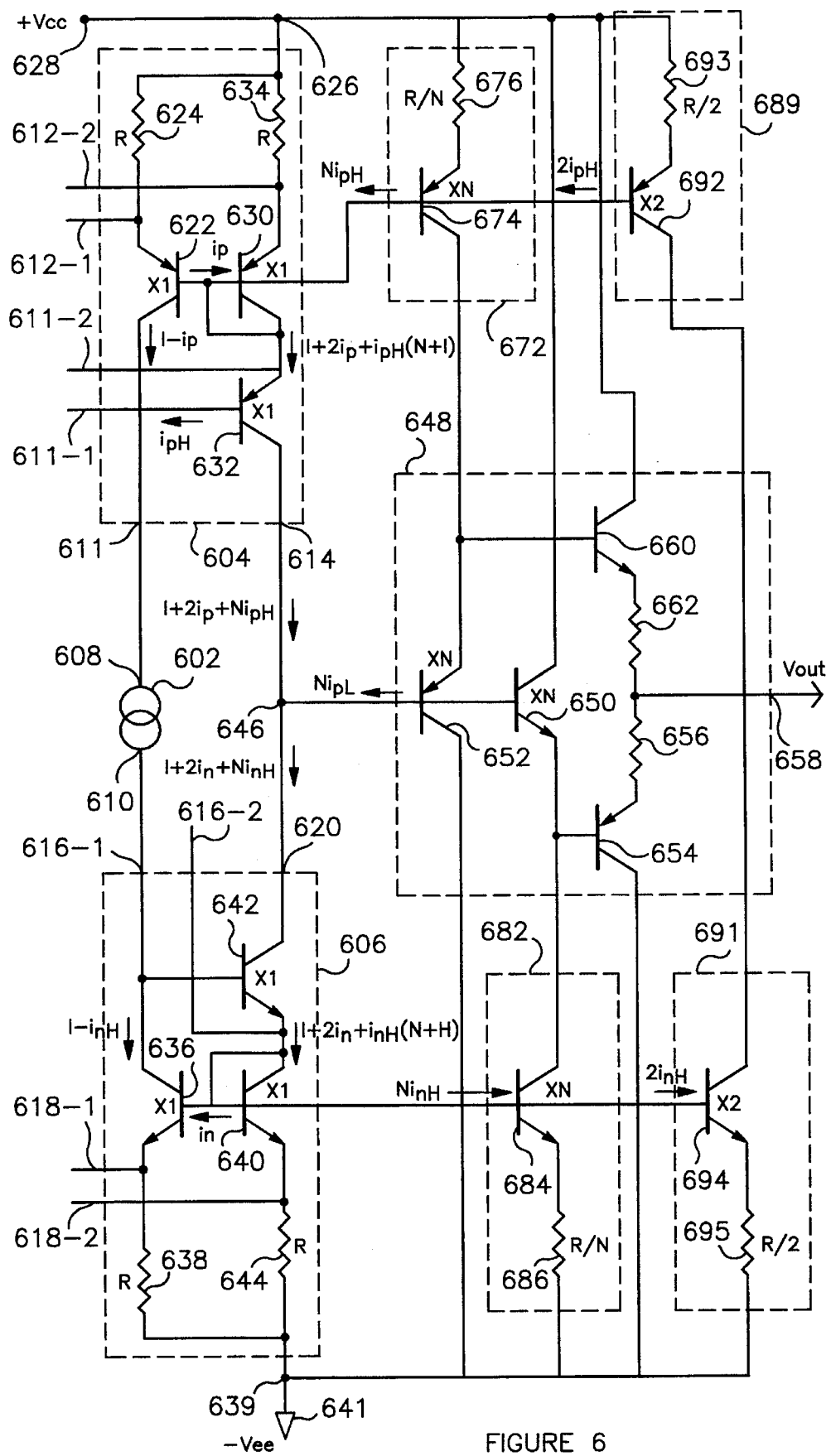
FIG. 6 is a schematic diagram illustrating a dual current gain mirror with buffered output in accordance with a fourth embodiment of the present invention.

Referring to FIG. 6, there is shown a schematic diagram illustrating a dual current gain mirror with buffered output according to a fourth embodiment of the present invention. An amplifier includes a DC programming current source 602 having first and second terminals 608, 610 for providing a programming current I to a first current source 604 and a second current source 606, respectively. The first current source 604 includes first input terminals 611-1, −2 (a differential current input terminal) for receiving the programming current I, a first input signal current, and a correction current, described later herein, and also includes second input terminals 612-1 and 612-2 (a differential current input terminal) for receiving a second input signal current, and also includes an output terminal 614 for providing an output signal current that is determined from the first and second input signal currents, the programming current I, and the correction current received at the input terminals 611 and 612.

Similarly, the second current source 606 includes first input terminals 616-1-2 (a differential current input terminal) coupled to the second terminal 610 of the bias current source 602 for receiving a first input signal current, the programming current I, and a correction current, described later herein, second input terminals 618-1 and 618-2 (a differential current input terminal) for receiving a second input signal current, and an output terminal 620 coupled to the output terminal 614 of the first current source to form a gain node 646 for providing an output signal current that is determined from the input signal currents, the programming current I, and the correction current received at the input terminals 616 and 618. The first current mirror 604 is similar to the current mirror 204 of FIG. 3. The second current mirror 606 is similar to the current mirror 206 of FIG. 3. It should be noted that the amplifier if coupled to external circuitry (not shown) preferably has either the first input terminals 611 and 616 or the second input terminals 612 and 618 coupled to such external circuitry.

The first and second current sources 604, 606 are Wilson current mirrors. The transistors in the second current mirror 606 are complementary in transistor type to the transistors in the first current mirror 604.

The input terminal 611-1 of the first current mirror circuit 604 is coupled to the common node of the collector of a pnp transistor 622 having a area factor $A_1$ and the base of a pnp transistor 632. The pnp transistor 632 has a area factor $A_1$. A resistor 624 couples the emitter of the pnp transistor 622 to a voltage terminal 626, which is coupled to an external voltage source 628 having a voltage Vcc. The base of the transistor 622 provides a gain node voltage independent bias current $i_p$ to the common node of the base and the collector of a pnp transistor 630, of the emitter of the pnp transistor 632, and of the input terminal 611-2. A resistor 634 couples the common node of the emitter of the pnp transistor 630 to the voltage terminal 626. The pnp transistor 630 has a area factor $A_1$. The resistance R of the resistors 624, 634 are equal. The first current mirror circuit 604 provides from the collector of the transistor 632 via the output terminal 614 a signal current that is approximately equal to the sum of the programming current I, twice the gain node voltage independent bias current $i_p$, and the N times an output voltage compliance dependent base current $i_{pH}$, which is described below.

The second current mirror circuit 606 is complementary to the first current mirror circuit 604 with npn transistors replacing pnp transistors and the resistors being coupled to a voltage Vee. More specifically, the input terminal 616-1 of the second current mirror 606 is coupled to the common node of the collector of an npn transistor 636 having a area factor $A_1$ and the base of an npn transistor 642 having a area factor $A_1$. A resistor 638 couples the emitter of the npn transistor 636 to a voltage terminal 639, which is coupled to an external voltage source 641 having a voltage Vee. The base of the transistor 636 provides a gain node voltage independent bias current $i_n$ to the common node of the base and the collector of an npn transistor 640, of the emitter of the npn transistor 642, and of the input terminal 616-2. A resistor 644 couples the emitter of the npn transistor 640 to the voltage terminal 639. The npn transistor 640 has an area factor of $A_1$. As with the first current mirror 604, the resistance R of the resistors 638, 644 are equal. The second current mirror circuit 606 provides from the collector of the transistor 642 via the output terminal 620 a signal current that is approximately equal to the sum of the programming current I, twice the gain node voltage independent bias current $i_n$, and the N times an output voltage compliance dependent base current $i_{nH}$, which is described below.

A buffer circuit 648 coupled to the gain node 646 has a high input impedance. The input impedance ranges from, for example, 20 megohms to 100 megohms. The buffer circuit 648 is similar to the buffer circuit 248 of FIG. 3. The buffer circuit 648 has an npn transistor 650 and a pnp transistor 652 each having a base coupled to the gain node 646. The transistors 650, 652 preferably each have an operating current of approximately N times the programming current I. A pnp transistor 654 and the npn transistor 650 are coupled in a Darlington arrangement. The base of the pnp transistor 654 is coupled to the emitter of the npn transistor 650. The collectors of the transistors 652, 654 are each coupled to the voltage terminal 639. A resistor 656 couples the emitter of the pnp transistor 654 to an output terminal 658 for providing an amplified drive current for driving a load (not shown). In a similar manner, a npn transistor 660 and the pnp transistor 652 are coupled in a Darlington arrangement. The base of the npn transistor 660 is coupled to the emitter of the pnp transistor 652. The collectors of the npn transistors 650, 660 are coupled to the voltage terminal 626. A resistor 662 couples the emitter of the npn transistor 660 to the output terminal 658. The base of the pnp transistor 652 provides an output voltage compliance dependent base current $N\times i_{p_l}$ to the gain node 646. The sum of the output voltage compliance dependent base currents $N\times i_{p_l}$ and $N\times i_{p_H}$ is substantially constant over the compliance range of the gain node 646. The base of the npn transistor 650 provides an output voltage compliance dependent base current $N\times i_{n_l}$ to the gain node 646. The sum of the output voltage compliance dependent base currents $N\times i_{n_l}$ and $N\times i_{n_H}$ is substantially constant over the compliance range of the gain node 646.

A third current source 672 comprises a resistor 676 coupling the emitter of a pnp transistor 674 to the voltage terminal 626. The pnp transistor 674 has an area factor $A_1\times N$. The resistance of the resistor 676 equals R/N. The base of the pnp transistor 674 is coupled to the input terminal 611-2 of the first current mirror 604 for providing a correction current, which is an output voltage compliance dependent base current approximately equal to N times the output voltage compliance dependent base current $i_{pH}$ of the pnp transistor 632 to compensate for the base current of the pnp transistor 652. The collector of the pnp transistor 674 is coupled to the common node of the emitter of the pnp transistor 652 and the base of the npn transistor 660, for providing a biasing current to the transistor 652.

A fourth current source 682 comprises a resistor 686 coupling the emitter of an npn transistor 684 to the voltage terminal 640. The npn transistor 684 has an area factor $A_1\times N$. The resistance of the resistor 686 equals R/N. The base of the npn transistor 684 is coupled to the input terminal 616-2 of the second current mirror 606 for providing a correction current, which is an output voltage compliance dependent base current approximately equal to N times the output voltage compliance dependent base current $i_{nH}$ of the npn transistor 642 to compensate for the base current of the npn transistor 650. The collector of the npn transistor 684 is coupled to the common node of the emitter of the npn transistor 650 and the base of the second pnp transistor 654, for providing a biasing current to the transistor 650.

One transistor is shown in each current sources 672, 682 for illustrative purposes; the current sources may be, for example, multiple transistors. For N pnp transistors and N npn transistors, the transistors 674, 684 each preferably have an area factor of A1.

A fifth current source 689 provides a compensation current to the current mirror 604 to substantially increase the output impedance of the first current source 604. In particular, the compensation current compensates for the output voltage compliance dependent base current of the pnp transistor 632, which is dependent on the voltage on the output terminal 614. The fifth current source 689 includes a pnp transistor 692 having a base coupled to the input terminal 611-2 and having a collector coupled to the output terminal 614. A resistor 693 couples the emitter of the pnp transistor 692 to the voltage terminal 626. The resistance of the resistor 693 is preferably R/2. The compensation current of the fifth current source 689 is approximately equal to two times the output voltage compliance dependent base current $i_{ph}$ of the pnp transistor 632. The pnp transistor 692 preferably has an area factor approximately equal to $2\times A_1$.

A sixth current source 691 provides a compensation current to the current mirror 606 to substantially increase the output impedance of the second current source 606. In particular, the compensation current compensates for the output voltage compliance dependent base current of the npn transistor 642, which is dependent on the voltage on the output terminal 620. The sixth current source 691 includes an npn transistor 694 having its base coupled to the input terminal 616-2 and having a collector coupled to the output terminal 658. A resistor 695 couples the emitter of the npn transistor 694 to the voltage terminal 640. The resistance of the resistor 695 is preferably R/2. The compensation current of the sixth current source 691 is approximately equal to two times the output voltage compliance dependent base current $i_{nH}$ of the npn transistors 642. The npn transistor 694 preferably has an area factor approximately equal to $2\times A_1$.

The present invention provides an amplifier including an output buffer having a high input impedance that is maintained over the voltage compliance of the output buffer. Output loading effects can be substantially cancelled by using the base current sensing of the amplifier of FIG. 4.

I claim:

1. An amplifier comprising:

first and second current sources each having a first input for receiving a programming current, a second input for receiving an input signal current, and a first output for providing a signal current, the second current source being complementary of the first current source, the first output of the first current source being coupled to the first output of the second current source to form a gain node;

third and fourth current sources each having an first terminal coupled to the second input of the respective first and second current sources for providing a correction current and each having a second terminal for providing a biasing current, the fourth current source being complementary of the third current source;

an output buffer having an input node coupled to the gain node for receiving the output signal current and having an output node for providing an amplified drive current, the output buffer comprising:

a first transistor of a first type having a base coupled to the input node of the output buffer, having an emitter coupled to the second terminal of the third current source, and having a collector, a first transistor of the second type having a base coupled to the base of the first transistor of the first type, having an emitter coupled to the second terminal of the fourth current source, and having a collector, a second transistor of the first type having a base coupled to the emitter of the first transistor of the second type, having an emitter coupled to the output node of the buffer, and having a collector, and a second transistor of the second type having a base coupled to the emitter of the first transistor of the first type, having an emitter coupled to the emitter of the second transistor of the first type, and having a collector;

a fifth current source having a first terminal coupled to the output node of the buffer and having a second terminal coupled to the second input of the first current source to substantially increase an output impedance of the first current source; and a sixth current source having a first terminal coupled to the output of the buffer and having a second terminal coupled to the second input of the second current source for providing a compensation current to substantially increase an output impedance of the second current source.

2. The amplifier of claim 1 wherein the first and second current sources are Wilson current mirrors.

3. The amplifier of claim 2 wherein the first current source comprises:
a first resistor having first and second terminals,
a second resistor having a first terminal and having a second terminal coupled to the second terminal of the first resistor,
a third transistor of the first type having an emitter coupled to the first terminal of the first resistor, having a base, and having a collector coupled to a common node of the second input of the first current source and the base of the third transistor of the first type,
a fourth transistor of the first type having an emitter coupled to the first terminal of the second resister, having a base coupled to the base of the third transistor of the first type, and having a collector, and
a fifth transistor of the first type having an emitter coupled to a collector of the third transistor of the first type, having a base coupled to the collector of the fourth transistor of the first type, and having a collector coupled to the first output of the first current source,
and the second current source comprises:
a third resistor having first and second terminals,
a fourth resistor having a first terminal and having a second terminal coupled to the second terminal of the third resistor,
a third transistor of the second type having an emitter coupled to the first terminal of the third resistor, having a base and having a collector coupled to the second input of the second current source,
a fourth transistor of the second type having an emitter coupled to the first terminal of the fourth resistor, having a base coupled to the base of the third transistor of the second type, and having a collector, and
a fifth transistor of the second type having a emitter coupled to the collector of the third transistor of the second type, having a base coupled to the collector of the fourth transistor of the second type, and having a collector coupled to the first output of the second current source.

4. The amplifier of claim 3 wherein the compensation current from the fifth current source is indicative of an output voltage compliance dependent base current of the fifth transistor of the first type and the compensation current from the sixth current source is indicative of an output voltage compliance dependent base current of the fifth transistor of the second type.

5. The amplifier of claim 2 wherein
the fifth current source comprises a third transistor of the first type having an emitter, having a base coupled to the second input of the first current source, and having a collector coupled to the output of the buffer; and
the sixth current source comprises a third transistor of the second type having an emitter, having a base coupled to the second input of the second current source, and having a collector coupled to the output of the buffer.

6. An amplifier comprising:
first and second current sources each having a first input for receiving a programming current, a second input, a third input for receiving an input signal current, and a first output for providing a signal current, the second current source being complementary of the first current source, the first output of the first current source being coupled to the first output of the second current source to form a gain node;
third and fourth current sources each having an first terminal coupled to the second input of the respective first and second current sources for providing a correction current and each having a second terminal for providing a biasing current, the fourth current source being complementary of the third current source;
an output buffer having an input node coupled to the gain node for receiving the output signal current and having an output node for providing an amplified drive current, the output buffer comprising:
a first transistor of a first type having a base coupled to the input node of the output buffer, having an emitter coupled to the second terminal of the third current source, and having a collector,
a first transistor of the second type having a base coupled to the base of the first transistor of the first type, having an emitter coupled to the second terminal of the fourth current source, and having a collector,
a second transistor of the first type having a base coupled to the emitter of the first transistor of the second type, having an emitter coupled to the output node of the buffer, and having a collector, and
a second transistor of the second type having a base coupled to the emitter of the first transistor of the first type, having an emitter coupled to the emitter of the second transistor of the first type, and having, a collector;
a fifth current source having a first terminal coupled to the output node of the buffer and having a second terminal coupled to the second input of the first current source to substantially increase an output impedance of the first current source; and
a sixth current source having a first terminal coupled to the output of the buffer and having a second terminal coupled to the second input of the second current source for providing a compensation current to substantially increase an output impedance of the second current source.

7. The amplifier of claim 6 wherein the first and second current sources are Wilson current mirrors.

8. The amplifier of claim 7 wherein the first current source comprises:
first resistor having first and second terminals,
a second resistor having a first terminal and having a second terminal coupled to the second terminal of the first resistor,
a third transistor of the first type having an emitter coupled to the first terminal of the first resistor, having a base, and having a collector coupled to a common node of the second input of the first current source and the base of the third transistor of the first type,
a fourth transistor of the first type having an emitter coupled to the first terminal of the second resister, having a base coupled to the base of the third transistor of the first type, and having a collector, and
a fifth transistor of the first type having an emitter coupled to a collector of the third transistor of the first type, having a base coupled to the collector of the fourth transistor of the first type, and having a collector coupled to the first output of the first current source,
and the second current source comprises:
a third resistor having first and second terminals,
a fourth resistor having a first terminal and having a second terminal coupled to the second terminal of the third resistor,
a third transistor of the second type having an emitter coupled to the first terminal of the third resistor, having a base, and having a collector coupled to the second input of the second current source, a fourth transistor of the second type having an emitter coupled to the first terminal of the fourth resistor, having a base coupled to the base of the third transistor of the second type, and having a collector, and a fifth transistor of the second type having a emitter coupled to the collector of the third transistor of the second type, having a base coupled to the collector of the fourth transistor of the second type, and having a collector coupled to the first output of the second current source.

9. The amplifier of claim 8 wherein the compensation current from the fifth current source is indicative of an output voltage compliance dependent base current of the fifth transistor of the first type and the compensation current from the sixth current source is indicative of an output voltage compliance dependent base current of the fifth transistor of the second type.

10. The amplifier of claim 7 wherein the fifth current source comprises a third transistor of the first type having an emitter, having a base coupled to the second input of the first current source, and having a collector coupled to the output of the buffer; and the sixth current source comprises a third transistor of the second type having an emitter, having a base coupled to the second input of the second current source, and having a collector coupled to the output of the buffer.

* * * * *